United States Patent
Yang

(10) Patent No.: US 8,120,965 B2
(45) Date of Patent: Feb. 21, 2012

(54) DATA STORAGE DEVICE AND DATA READ METHOD

(75) Inventor: Tsung-Chieh Yang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 100 days.

(21) Appl. No.: 12/785,896

(22) Filed: May 24, 2010

(65) Prior Publication Data

US 2011/0022886 A1    Jan. 27, 2011

(30) Foreign Application Priority Data

Jul. 22, 2009   (TW) ............................... 98124692 A

(51) Int. Cl.
  *G11C 16/06*   (2006.01)
  *G11C 16/04*   (2006.01)
  *G11C 29/00*   (2006.01)
(52) U.S. Cl. ......... 365/185.21; 365/185.18; 365/189.15; 714/718; 714/721
(58) Field of Classification Search .............. 365/185.21
  See application file for complete search history.

(56) References Cited

U.S. PATENT DOCUMENTS

| | | | | |
|---|---|---|---|---|
| 5,729,490 | A  * | 3/1998 | Calligaro et al. | 365/185.03 |
| 6,002,612 | A  * | 12/1999 | Noda et al. | 365/185.09 |
| 6,678,192 | B2 * | 1/2004 | Gongwer et al. | 365/185.2 |
| 7,495,955 | B2 * | 2/2009 | Ido | 365/185.02 |
| 7,843,725 | B2 * | 11/2010 | Sarin et al. | 365/185.03 |
| 7,865,797 | B2 * | 1/2011 | Eguchi et al. | 714/752 |
| 2009/0129146 | A1 * | 5/2009 | Sarin et al. | 365/185.02 |
| 2010/0002506 | A1 * | 1/2010 | Cho et al. | 365/185.03 |
| 2010/0135074 | A1 * | 6/2010 | Alrod et al. | 365/185.02 |
| 2010/0211833 | A1 * | 8/2010 | Weingarten | 714/704 |

* cited by examiner

*Primary Examiner* — Son Mai
(74) *Attorney, Agent, or Firm* — Wang Law Firm, Inc.; Li K. Wang

(57) ABSTRACT

The invention provides a data read method. First, a training sequence stored in a storage unit of a memory is read according to at least one sense voltage to obtain a read-out training sequence. Whether the read-out training sequence is correct is then determined. When the read-out training sequence is not correct, the sense voltage is adjusted.

20 Claims, 4 Drawing Sheets

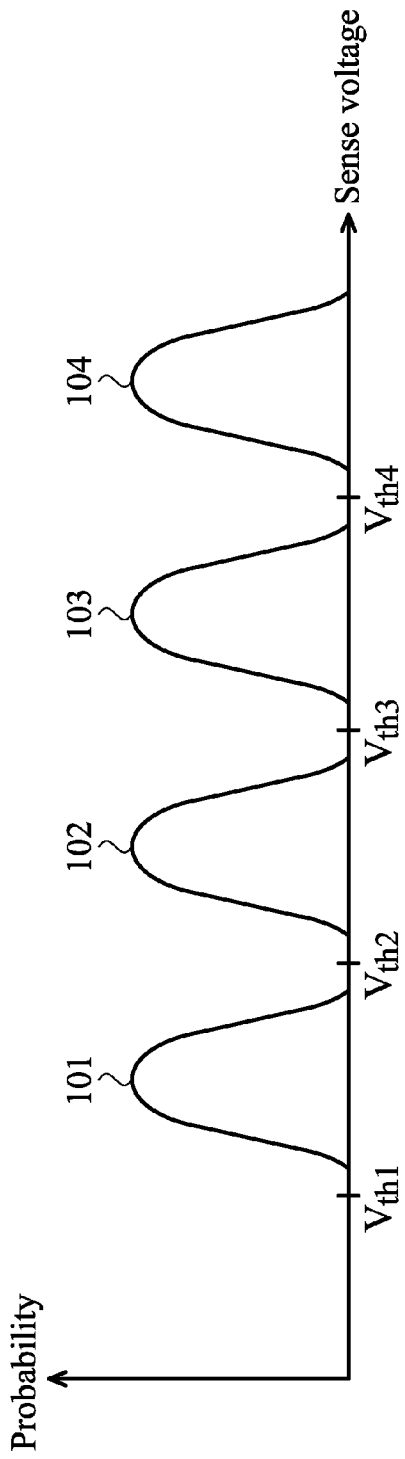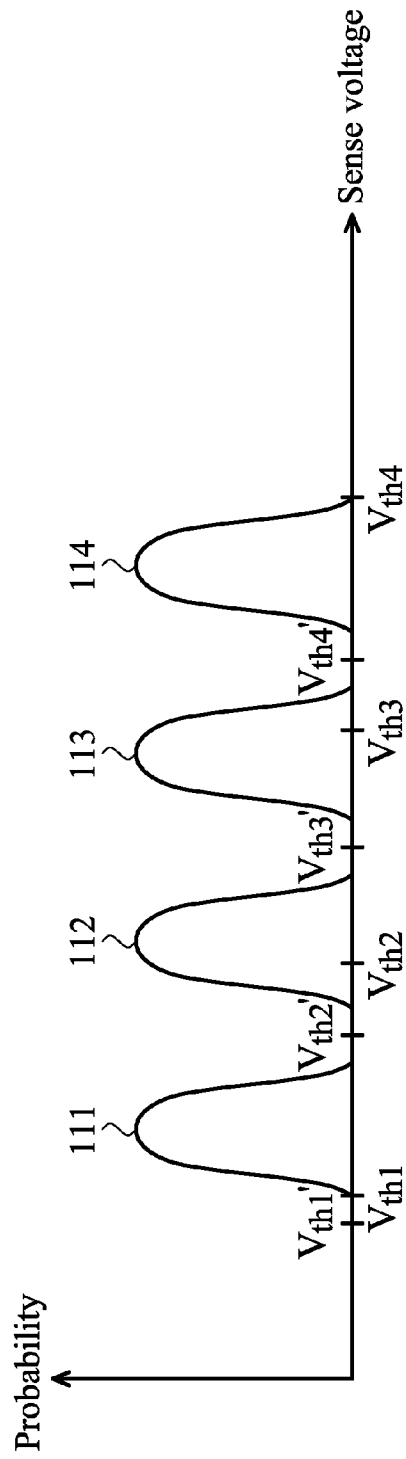

DATA STORAGE DEVICE AND DATA READ METHOD

CROSS REFERENCE TO RELATED APPLICATIONS

This Application claims priority of Taiwan Patent Application No. 98124692, filed on Jul. 22, 2009, the entirety of which is incorporated by reference herein.

BACKGROUND OF THE INVENTION

1. Field of the Invention

The invention relates to memories, and more particularly to reading data from memories.

2. Description of the Related Art

A memory comprises a plurality of storage units for storing data. For example, a flash memory comprises a plurality of blocks, and each of the blocks comprises a plurality of pages. The pages and the blocks are storage units of the flash memory. When a memory receives a write command from a controller, the memory stores data to storage units thereof according to the write command. When a memory receives a read command from a controller, the memory reads data from storage units thereof according to the read command, and then sends the data back to the controller. A memory generally reads data with a sense amplifier. A first terminal of the sense amplifier is coupled to a sense voltage, and a second terminal of the sense amplifier is coupled to an output terminal of a storage unit to be read. When the storage unit to be read outputs data to the output terminal, the sense amplifier compares the voltage on the output terminal of the storage unit with the sense voltage to determine whether the output data has a bit value of 0 or 1. The memory then sends the bit value of the output data to the controller, thus completing the data read operation.

When a plurality of storage units of a memory is read, the storage units storing the same data may output different voltages. For example, a storage unit with a location near a voltage source may output a higher voltage, and a storage unit with a location far from the voltage source may output a lower voltage. In addition, a storage unit may output different voltages when neighboring storage units store different data values. When a sense amplifier of a memory determines bit values of a plurality of storage units according to the same sense voltage, some of the bit values of the storage units may be wrongly identified, leading to read process errors.

Referring to FIG. 1A, a schematic diagram of probability distribution of an output voltage of a normal memory cell of a multi-level cell (MLC) memory is shown. Assume that the normal memory cell of the MLC memory can output four voltage levels, each voltage level corresponds to one of four storage bit combination 00, 01, 10, and 11, and the probability distributions of the four voltage levels are respectively marked as 101, 102, 103, and 104. The memory compares an output voltage of a memory cell with a set of sense voltages $V_{th1}$, $V_{th2}$, $V_{th3}$, and $V_{th4}$ to determine whether an output data value of the memory cell is 00, 01, 10, or 11. Referring to FIG. 1B, a schematic diagram of probability distribution of an output voltage of an abnormal memory cell of a multi-level cell (MLC) memory is shown. The abnormal memory cell can output four voltage levels, each voltage level corresponds to one of four storage bit combinations 00, 01, 10, and 11, and the probability distributions of the four voltage levels are respectively marked as 111, 112, 113, and 114.

In comparison with FIG. 1A, the output voltage of the abnormal memory cell is apparently lower than that of the normal memory cell. If the memory compares the output voltage of the abnormal memory cell with the original set of sense voltages $V_{th1}$, $V_{th2}$, $V_{th3}$, and $V_{th4}$ to determine whether an output data value of the abnormal memory cell is 00, 01, 10, or 11, the memory may obtain an erroneous output data value. Thus, a data read method is required to adjust the sense voltage for different memory cells to ensure accuracy of the identified output data value.

BRIEF SUMMARY OF THE INVENTION

The invention provides a data read method. First, a training sequence stored in a storage unit of a memory is read according to at least one sense voltage to obtain a read-out training sequence. Whether the read-out training sequence is correct is then determined. When the read-out training sequence is not correct, the sense voltage is adjusted.

The invention also provides a data storage device. In one embodiment, the data storage device comprises a memory and a controller. The memory comprises a plurality of storage units, wherein each of the storage units stores a training sequence. When the data storage device is requested to read a target storage unit of the storage units, the controller directs the memory to read the training sequence stored in the target storage unit according to at least one sense voltage to obtain a read-out training sequence, determines whether the read-out training sequence is correct, and directs the memory to adjust the sense voltage when the read-out training sequence is not correct.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1A is a schematic diagram of probability distribution of an output voltage of a normal memory cell of a multi-level cell (MLC) memory;

FIG. 1B is a schematic diagram of probability distribution of an output voltage of an abnormal memory cell of an MLC memory;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
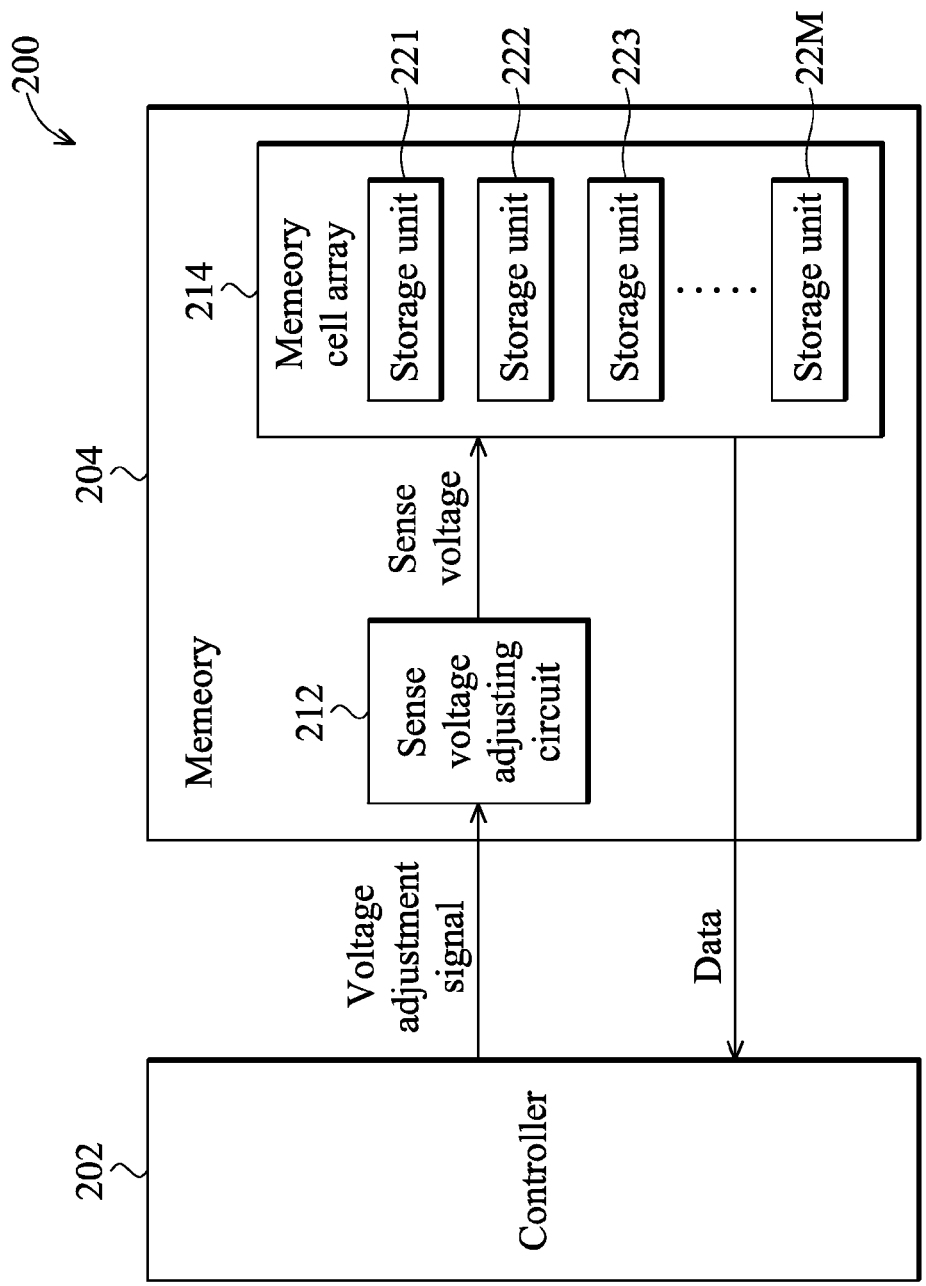
FIG. 2 is a block diagram of a data storage device according to the invention.

Referring to FIG. 2, a block diagram of a data storage device 200 according to the invention is shown. The data storage device 200 is coupled to a host, and stores data for the host. In one embodiment, the data storage device 200 comprises a controller 202 and a memory 204. In one embodiment, the memory 204 comprises a sense voltage adjusting circuit 212 and a memory cell array 214. The memory cell array 214 comprises a plurality of storage units 221~22M for data storage. In one embodiment, the memory 204 is a flash memory, and the storage units 221~22M are blocks or pages of the flash memory 204. Data is erased from the memory 204 in a unit of a block, and data is written to the memory 204 in a unit of a page. When the controller 202 receives a write command and data, the controller 202 directs the memory 204 to write the data to the storage units 221~22M. When the controller 202 receives a read command from the host, the controller 202 reads data from the storage units 221~22M, and then sends the data back to the host to complete execution of the read command.

Figure 3:
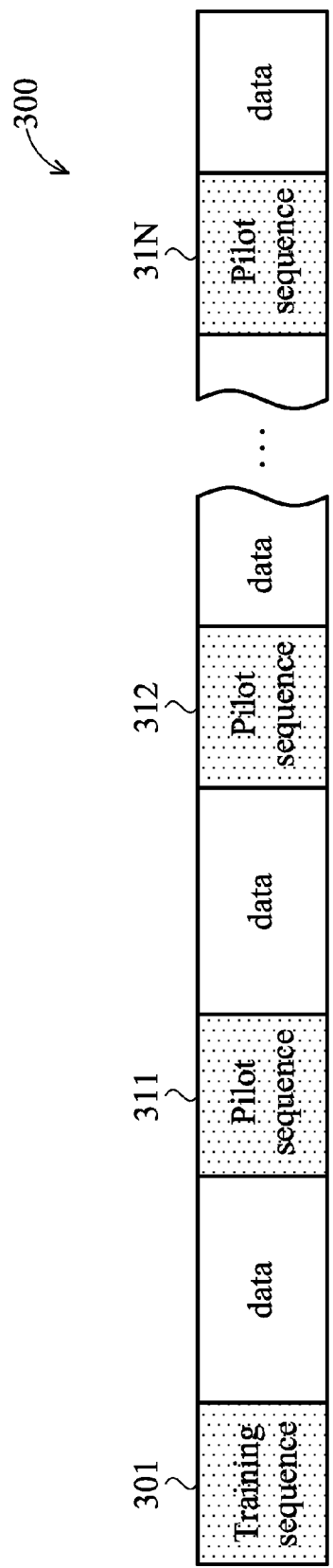
FIG. 3 is a schematic diagram of data stored in a storage unit according to the invention.

Before the controller 202 stores data to the storage units 221~22M, the controller 202 first stores a training sequence in starting portions of the storage units 221-22M. The controller 202 then stores data in portions subsequent to the starting portions of the storage units 221~22M. In addition, the controller 202 inserts a plurality of pilot sequences between data segments stored in the storage units 221~22M. Referring to FIG. 3, a schematic diagram of data stored in a storage unit 300 according to the invention is shown. A starting portion of the storage unit 300 stores a training sequence 301, and other portions of the storage unit 300 store ordinary data segments. In addition, the storage unit 300 also stores a plurality of pilot sequences 311~31N inserted between the data segments. The amount of data of the training sequence 301 is greater than those of the pilot sequences 311~31N. In one embodiment, the training sequence 301 comprises two data bytes, and the pilot sequences 311~31N respectively comprises 1 data byte.

A training sequence is data comprising predetermined bit patterns and is stored in a storage unit for coarse adjustment of a sense voltage for detecting output data of the storage unit. An example of the bit pattern of a two-byte training sequence is "0011001101010101". Similarly, a pilot sequence is data comprising predetermined bit patterns and is stored in a storage unit for fine adjustment of a sense voltage for detecting output data of the storage unit. In one embodiment, the storage unit 300 shown in FIG. 3 is a block comprising a plurality of pages, a starting portion of the block stores the training sequence 301 for coarsely adjusting a sense voltage, and starting portions of the pages store the pilot sequences 311~31N to finely tune the sense voltage. In another embodiment, the storage unit 300 shown in FIG. 3 is a page comprising a plurality of sectors, a starting portion of the page stores the training sequence 301 for coarsely adjusting a sense voltage, and starting portions of the sectors store the pilot sequences 311~31N to finely tune the sense voltage. The controller 302 can store the training sequence 301 and the pilot sequences 311~31N at any specific locations of the storage unit 300.

When a host requests the controller 202 to read data, the controller 202 reads data from the storage units 221~22M according to instructions of the host. The memory cell array 214 generates an output voltage according to a data value stored in a storage unit being read by the controller 202. The memory cell array 214 then compares the output voltage with a sense voltage to determine the data value of the storage unit being read by the controller 202. The memory 204 then delivers the determined data value to the controller 202, and the controller 202 then sends the determined data value back to the host to complete the data read operation. When the sense voltage is not suitable for a property of the storage unit being read, the data value determined by comparing the sense voltage with the output voltage of the storage unit may be wrongly identified. For example, when a storage unit is frequently erased and then programmed with new data, the property of the storage unit may change, and the sense voltage must be correspondingly adjusted to suit the property change of the storage unit. Because the storage units 221~22M store training sequences and pilot sequences, the controller 202 can adjust the sense voltage of the memory 204 according to accuracy of the identified read-out data of the training sequences and the pilot sequences. Thus, the sense voltage can be correspondingly adjusted according to the property of the storage unit being read, so that accuracy of the identified read-out data from the storage unit is ensured. In one embodiment, the controller 202 generates a voltage adjustment signal to direct a sense voltage adjusting circuit 212 to adjust the sense voltage of the memory 204 according to read-out data of training sequences and pilot sequences.

Figure 4:
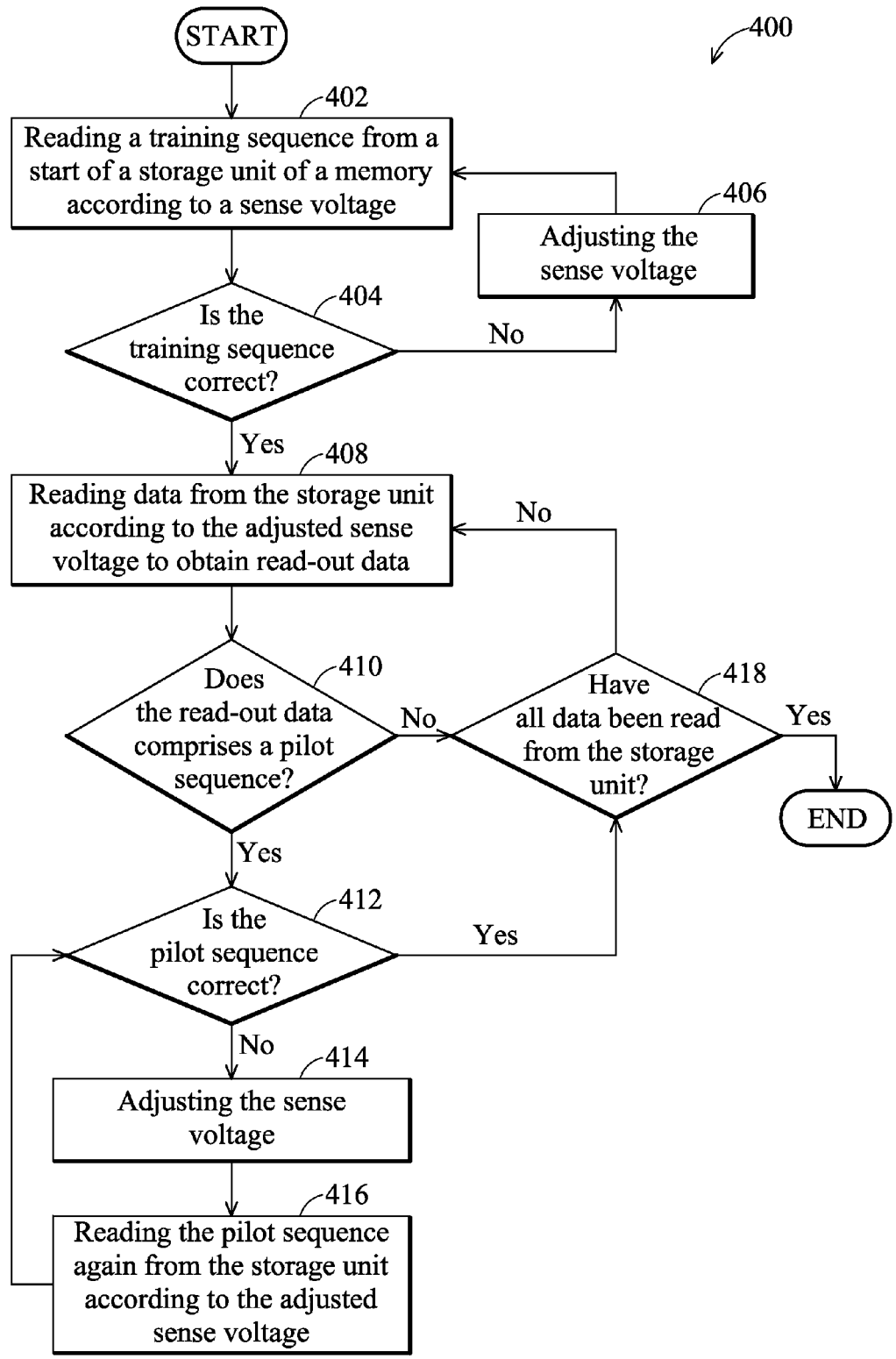
FIG. 4 is a flowchart of a data read method of a memory according to the invention.

Referring to FIG. 4, a flowchart of a data read method 400 of a memory 204 according to the invention is shown. First, the controller 202 directs the memory 204 to read a training sequence from a storage unit of the memory 204 according to at least one sense voltage to obtain a read-out training sequence (step 402). In one embodiment, the training sequence is stored at a staring portion of the storage unit. The controller 202 then determines whether the read-out training sequence is correct (step 404). In one embodiment, the controller 202 compares the read-out training sequence with predetermined data of the training sequence to determine whether the read-out training sequence is correct. If the read-out training sequence is different from the predetermined data of the training sequence, the controller 202 determines that the read-out training sequence is not correct. When the read-out training sequence is determined to be erroneous (step 404), the controller 202 sends a voltage adjustment signal to direct the memory 204 to adjust the sense voltage according to an error type of the read-out training sequence (step 406). For example, if predetermined data of a training sequence is "0011001101010101", and a read-out training sequence is "0011001100000000", the error type of the read-out training sequence is from the correct bits "01" to the error bits "00", and the controller 202 directs the memory 204 to lower the sense voltage from the value $V_{th2}$ shown in FIG. 1A to the value $V_{th2'}$ shown in FIG. 1B, and the memory 204 can then correctly identify bit values of the read-out training sequence and subsequent read-out data. The controller 202 then directs the memory 204 to read the training sequence from the storage unit again according to the adjusted sense voltage to obtain a new read-out training sequence (step 402). Adjustment of the sense voltage and reading the training sequence are repeated until the new read-out training sequence is correct (step 404). The memory 204 then reads data from the storage unit according to the adjusted sense voltage to obtain mad-out data (step 408). The sense voltage is therefore adjusted according to the property of the storage unit to ensure accuracy of the read-out data from the storage unit.

Because the storage unit being read may store a large amount of data, and the sense voltage for reading subsequent data from the storage unit also be required to be finely tuned, the controller 202 continues to adjust the sense voltage of the memory 204 according to accuracy of the read-out data of the pilot sequences stored in the storage unit, thus ensuring accuracy of subsequent read-out data. When the memory 204 reads subsequent data from the storage unit, the controller 202 determines whether subsequent read-out data comprises a read-out pilot sequence (step 410). If so, the controller 202 determines whether the mad-out pilot sequence is correct (step 412). In one embodiment, the controller 202 compares the read-out pilot sequence with predetermined data of the pilot sequence to determine whether the read-out pilot sequence is correct. If the read-out pilot sequence is different from the predetermined data of the pilot sequence, the controller 202 determines that the mad-out pilot sequence is not correct. When the mad-out pilot sequence is determined to be erroneous (step 412), the controller 202 sends a voltage adjustment signal to direct the memory 204 to finely adjust the sense voltage (step 414). The process of the step 414 is similar to that of the step 406. The controller 202 then directs the memory 204 to read the pilot sequence from the storage unit again according to the adjusted sense voltage to obtain a new read-out pilot sequence (step 416). Adjustment of the sense voltage and reading the pilot sequence are repeated until the new mad-out pilot sequence is correct (step 412). The memory 204 then reads subsequent data from the storage unit according to the adjusted sense voltage (step 408) until all data have been read from the storage unit (step 418). The sense voltage is therefore adjusted according to the property of the storage unit to ensure accuracy of the read-out data from the storage unit even if the storage unit stores a large amount of data.

The invention can be applied to all kinds of flash memories comprising memory cells of any number of bits. The embodiments of the invention can be applied to a single-level-cell (SLC) memory or a multiple-level-cell (MLC) memory.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data read method, comprising:
   reading a training sequence stored in a storage unit of a memory according to at least one sense voltage to obtain a read-out training sequence;
   determining whether the read-out training sequence is correct; and
   when the read-out training sequence is not correct, adjusting the sense voltage.

2. The data read method as claimed in claim 1, wherein adjusting the sense voltage comprising:
   when the read-out training sequence is not correct, adjusting the sense voltage;
   reading the training sequence from the storage unit again according to the adjusted sense voltage to obtain a new read-out training sequence;
   repeatedly adjusting the sense voltage and reading the training sequence until the new read-out training sequence is correct; and
   reading data from the storage unit according to the newly adjusted sense voltage.

3. The data read method as claimed in claim 1, wherein adjusting the sense voltage comprises:
   adjusting the sense voltage according to an error type of the read-out training sequence.

4. The data read method as claimed in claim 1, wherein the training sequence is stored in a start portion of the storage unit or a specific location of the storage unit.

5. The data read method as claimed in claim 1, wherein determining of whether the read-out training sequence is correct comprises:
   comparing the read-out training sequence with predetermined data; and
   when the read-out training sequence is identical to the predetermined data, determining that the read-out training sequence is correct.

6. The data read method as claimed in claim 1, wherein the storage unit stores at least one pilot sequence in addition to the training sequence.

7. The data read method as claimed in claim 6, wherein the method further comprises:
   reading data from the storage unit according to the adjusted sense voltage to obtain read-out data;
   determining whether a read-out pilot sequence of the read-out data is correct;
   when the read-out pilot sequence is not correct, adjusting the sense voltage and reading the storage unit according to the newly adjusted sense voltage to obtain a new read-out pilot sequence until the new read-out pilot sequence is correct; and
   reading subsequent data from the storage unit according to the newly adjusted sense voltage.

8. The data read method as claimed in claim 6, wherein the amount of data of the at least one pilot sequence is less than that of the training sequence.

9. The data read method as claimed in claim 6, wherein the storage unit is a block of the memory, the block comprises a plurality of pages, a starting portion of the block stores the training sequence for coarse adjustment of the sense voltage, and starting portions of the pages store the at least one pilot sequence for fine adjustment of the sense voltage.

10. The data read method as claimed in claim 6, wherein the storage unit is a page of the memory, the page comprises a plurality of sectors, a starting portion of the page stores the training sequence for coarse adjustment of the sense voltage, and starting portions of the sectors store the at least one pilot sequence for fine adjustment of the sense voltage.

11. A data storage device, comprising:
    a memory, comprising a plurality of storage units, wherein each of the storage units stores a training sequence;
    a controller, when the data storage device is requested to read a target storage unit of the storage units, directing the memory to read the training sequence stored in the target storage unit according to at least one sense voltage to obtain a read-out training sequence, determining whether the read-out training sequence is correct, and directing the memory to adjust the sense voltage when the read-out training sequence is not correct.

12. The data storage device as claimed in claim 11, wherein when the read-out training sequence is not correct, the controller directs the memory to adjust the sense voltage and read the training sequence from the target storage unit again according to the adjusted sense voltage to obtain a new read-out training sequence until the new read-out training sequence is correct, and then directs the memory to read data from the target storage unit according to the newly adjusted sense voltage.

13. The data storage device as claimed in claim 11, wherein when the read-out training sequence is not correct, the controller directs the memory to adjust the sense voltage according to an error type of the read-out training sequence.

14. The data storage device as claimed in claim 11, wherein the training sequences are stored from start portions of the storage units or specific locations of the storage units.

15. The data storage device as claimed in claim 11, wherein the controller compares the read-out training sequence with predetermined data, and determines that the read-out training sequence is correct when the read-out training sequence is identical to the predetermined data.

16. The data storage device as claimed in claim 11, wherein each of the storage units stores at least one pilot sequence in addition to the training sequences.

17. The data storage device as claimed in claim 16, wherein the controller directs the memory to read data from the target storage unit according to the adjusted sense voltage to obtain read-out data, determines whether a read-out pilot sequence of the read-out data is correct, and when the read-out pilot sequence is not correct, the controller directs the memory to adjust the sense voltage and read the target storage unit according to the newly adjusted sense voltage to obtain a new read-out pilot sequence until the new read-out pilot sequence is correct, and then directs the memory to read subsequent data from the target storage unit according to the newly adjusted sense voltage.

18. The data storage device as claimed in claim 16, wherein amount of data of the at least one pilot sequence is less than that of the training sequences.

19. The data storage device as claimed in claim 16, wherein the storage units are blocks of the memory, each of the blocks comprises a plurality of pages, starting portions of the blocks store the training sequences for coarse adjustment of the sense voltage, and starting portions of the pages store the at least one pilot sequence for fine adjustment of the sense voltage.

20. The data storage device as claimed in claim 16, wherein the storage units are pages of the memory, each of the pages comprises a plurality of sectors, starting portions of the pages store the training sequences for coarse adjustment of the sense voltage, and starting portions of the sectors store the at least one pilot sequence for fine adjustment of the sense voltage.

* * * * *